United States Patent [19]

Nishiguchi

[11] Patent Number: 4,868,974
[45] Date of Patent: Sep. 26, 1989

[54] CHIP MOUNTING APPARATUS
[75] Inventor: Masanori Nishiguchi, Yokohama, Japan
[73] Assignee: Sumitomo Electric Industries, Ltd., Osaka, Japan
[21] Appl. No.: 237,578
[22] Filed: Aug. 29, 1988
[30] Foreign Application Priority Data Sep. 1, 1987 [JP] Japan .................. 62-218552
Sep. 1, 1987 [JP] Japan .................. 62-218553
Sep. 1, 1987 [JP] Japan .................. 62-218554

[51] Int. Cl.[4] ............................. H05K 3/30
[52] U.S. Cl. .................................. 29/740; 29/759
[58] Field of Search ............. 29/834, 709, 714, 740, 29/743, 759

[56] References Cited
U.S. PATENT DOCUMENTS 4,722,135 2/1988 Read ......................... 29/740
4,809,839 3/1989 Elliott ....................... 29/740 X

FOREIGN PATENT DOCUMENTS 2063227 6/1981 United Kingdom .

Primary Examiner—Carl E. Hall
Attorney, Agent, or Firm—Cushman, Darby & Cushman

[57] ABSTRACT

A chip mounting apparatus is provided with a base, a support member securely held on the base, a tray detachably mounted in the support member and provided with a plurality of substantially square concaves each for accommodating one of the chips, and an oscillating device for oscillating the tray. The concaves of the tray are regularly spaced from one another by a plurality of partition walls formed on the tray. The support member is capable of inclining the tray so that one corner of each concave may become lower than any other corners. In such a chip mounting apparatus, the chips are rearranged in order in the same corners of respective concaves upon oscillation of the tray.

3 Claims, 6 Drawing Sheets

CHIP MOUNTING APPARATUS

BACKGROUND OF THE INVENTION

1. Field of the Invention

The present invention relates to a chip mounting apparatus for sorting and subsequently readily mounting each of a large number of generally square chip components, for example, semiconductor chips, chip capacitors, chip resistors or the like onto a package base or a circuit board.

2. Description of the Prior Art

In general, a large number of semiconductor elements are initially formed into a certain pattern on a semiconductor wafer and are then individually separated into generally square chips. Prior to subsequent die-bonding process, the separated semiconductor chips are successively transported to a chip mounting apparatus, while being bonded on an adhesive expand tape. During the die-bonding process, the semiconductor chips are separated from the expand tape and then picked up one by one by a vacuum pickup collet or the like so as to be mounted on a package base. Alternatively, the chips separated from the tape are occasionally placed on a tray to be rearranged in order.

FIG. 1 depicts a tray 1 to be used for this purpose, which is provided at its upper surface with a plurality of generally square concaves 4 partitioned in regular order generally in the form of a checked pattern by a plurality of partition walls 2 and 3 crossing at right angles. The concaves 4 have the same configuration slightly greater than any chips so that each of the concaves 4 can accommodate any one of the chips regardless of size.

However, when the chips are placed on such a tray 1, they are located at different positions or angles inside respective concaves 4 as a rule, resulting in variations in positional relationship between the chips and the concaves 4 accommodating respective chips. Consequently, the vacuum pickup collet or the like occasionally fails to properly pick up the chips from the tray according to their locations, rendering some of such chips to drop from the collet or to be damaged at their corners. This problem necessitates an image processing system for identifying the position of the chips on the tray 1, which slows each pickup and causes the apparatus to become complicated or to be formed into a relatively large size.

SUMMARY OF THE INVENTION

Accordingly, the present invention has been developed with a view to substantially eliminate the above described disadvantage inherent in the prior art chip mounting apparatus, and has for its essential object to provide an improved chip mounting apparatus in which a plurality of chips are placed in order on a tray in a fashion such that each of the chips is accommodated in any one of a plurality of concaves formed in the tray in the same positional relationship between the chips and respective concaves.

Another important object of the present invention is to provide a chip mounting apparatus of the above described type which is capable of readily and speedily picking up the chips accommodated in respective concaves one by one with the use of a vacuum pickup collet.

A further object of the present invention is to provide a chip mounting apparatus which is stable in functioning and can be readily manufactured at a relatively low cost.

In accomplishing these and other objects, a chip mounting apparatus according to one preferred embodiment of the present invention is provided with a base, a support member securely held on the base, a tray detachably mounted in the support member and provided with a plurality of substantially square concaves each for accommodating one of the chips, and an oscillating means for oscillating the tray. The concaves of the tray are regularly spaced from one another by a plurality of partition walls formed on the tray. The support member is capable of inclining the tray so that one corner of each concave may become lower than any other corners thereof. The chip mounting apparatus having the above described construction makes it possible to rearrange the chips in order in the same corners of respective concaves.

Moreover, since a direction identification mark is formed on one corner of each chip, all of the chips can be directed in the same direction upon recognition of the direction identification mark when being picked up from the tray. This facilitates subsequent processing.

The chip mounting apparatus according to the present invention is further provided with a vacuum pickup collet having two projections located diagonally on its lower surface whereas the tray is provided with a plurality of cross-shaped notches at crossings of the partition walls. Accordingly, since there never occurs any interference between the collet and the partition walls of the tray, the collet can reliably and speedily pick up each chip.

BRIEF DESCRIPTION OF THE DRAWINGS

These and other objects and features of the present invention will become more apparent from the following description taken in conjunction with the preferred embodiment thereof with reference to the accompanying drawings, throughout which like parts are designated by like reference numerals, and in which.

DETAILED DESCRIPTION OF THE PREFERRED EMBODIMENT

Figure 1:
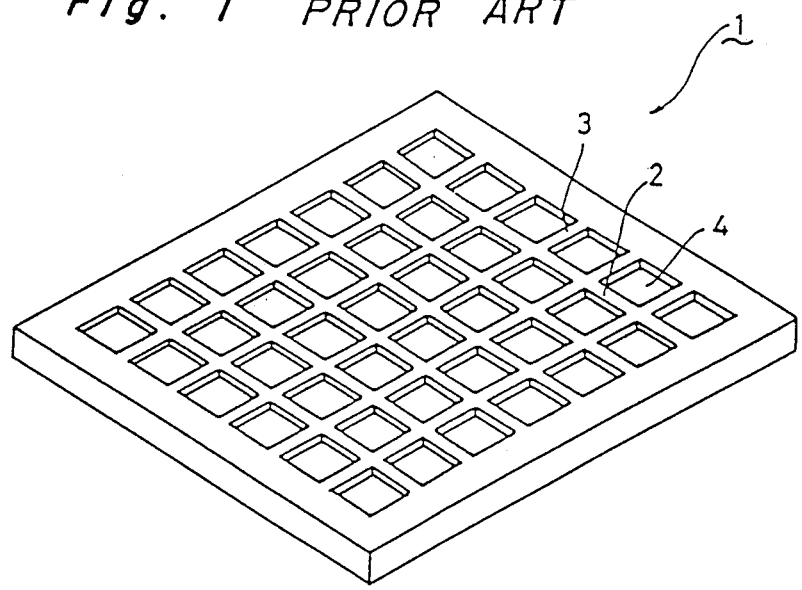
FIG. 1 is a perspective view of a conventional tray having therein a plurality concaves each for accommodating one chip.

FIGS. 2a to 2e depict a chip mounting apparatus according to one preferred embodiment of the present invention, which is provided with a base 10, a stage 11 securely held on the base 10, a vacuum pickup collet 15 for picking up one by one a plurality of chips placed on a tray 1 and the like. The stage 11 is comprised of a tray chuck 12 for securely holding or chucking therein the tray 1 shown in FIG. 1, and a lifter 13 for supporting and inclining the tray chuck 12. A hollow 14 is formed at an upper surface of the tray chuck 12 to securely hold therein the tray 1 by drawing the vacuum or by any other suitable holding means, for example, a mechanical chuck by virtue of a flat spring or the like.

Figure 2A:
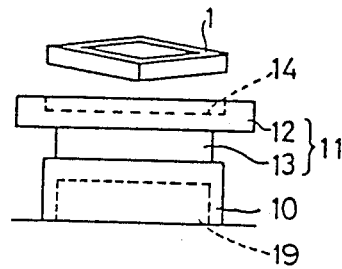
FIGS. 2a to 2e are side elevational views indicative of the construction and the operation of a chip mounting apparatus according to one preferred embodiment of the present invention.
Figure 2B:
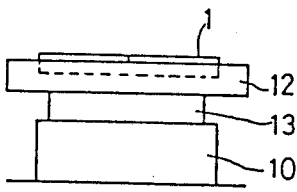
Figure 2C:
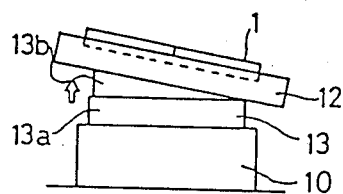

The lifter 13 is so operable as to incline the tray chuck 12 and is, therefore, connected with any suitable driving means (not shown) provided inside it or inside the base 10. The lifter 13 consists of an external cylinder 13a and an internal cylinder 13b which is reciprocably and rotatably inserted into the external cylinder 13a. Upon rotation and upward movement of the internal cylinder 13b, the tray chuck 12 is inclined, as shown in FIG. 2c.

FIGS. 3a to 3e show a modification of the chip mounting apparatus, which is provided with a lifter 13' comprised of at least two rods, preferably four rods, to incline the tray chuck 12 upon upward movement of any one of the rods.

The tray 1 is inclined together with the tray chuck 12 in a fashion such that one of the corners of each concave 4 formed in the tray 1 is located lower than any other corners. Because of this, one corner of each chip is positioned in one corner of the concave 4 for proper positioning of the chip.

It is to be noted here that the angle of inclination of the tray 1 should be a minute angle, for example, approximately 3 degrees. If the angle of inclination exceeds this value, the chips are always in danger of dropping from the tray 1.

The chip mounting apparatus of the present invention is further provided with an oscillating means 19 for oscillating the stage 11 or at least the tray chuck 12 thereof to oscillate the tray 1 together therewith. The oscillating means 19 may be accommodated in the base 10 of the apparatus or may be provided outside and connected to the base 10 by means of a rod or the like. The oscillation having a minute amplitude which never causes the chips to drop from the tray 1 is preferably selected to smoothly slide the chips. Such an oscillation is caused by, for example, a supersonic wave oscillating device.

The operation of the chip mounting apparatus having the above described construction will be explained hereinafter.

Figure 3A:
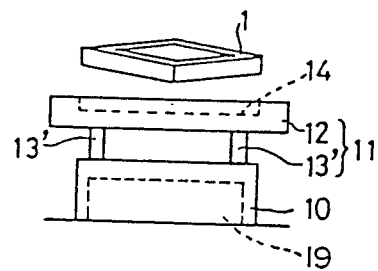
FIGS. 3a to 3e are views similar to FIGS. 2a to 2e, which particularly shows a modification thereof.
Figure 3B:
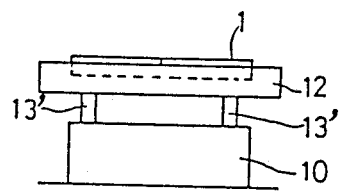
Figure 3C:
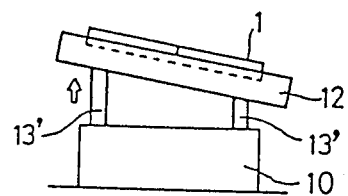
Figure 4A:
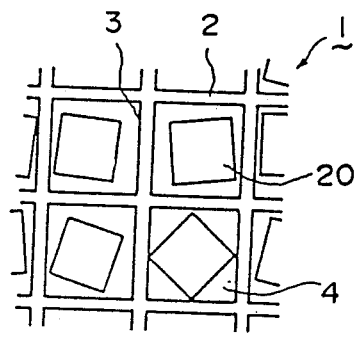
FIGS. 4a to 4c are top plan views of a portion of the tray, indicative of the way plurality of chips accommodated in respective concaves are rearranged in order.

As shown in FIGS. 2a and 2b or FIGS. 3a and 3b, the tray 1 provided with a plurality of concaves 4 each accommodating one chip is initially transported above and securely chucked in the hollow 14 formed in the tray chuck 12. In this event, the chips 20 are located at random at different positions in respective concaves 4, as shown in FIG. 4a. After the chucking of the tray 1, the tray chuck 12 is inclined upon operation of the lifter 13 or 13', thereby rendering the tray 1 to be inclined in a fashion such that one corner of each concave 4 is so positioned as to be lower than any other corners, as shown in FIG. 2c or FIG. 3c.

Figure 4B:
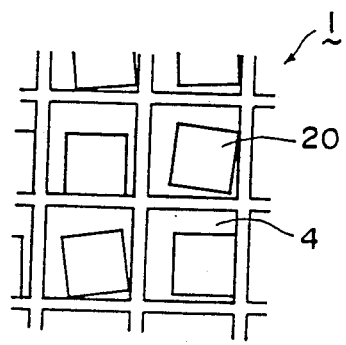
Figure 4C:
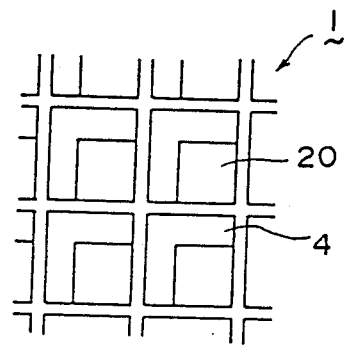
Figure 5A:
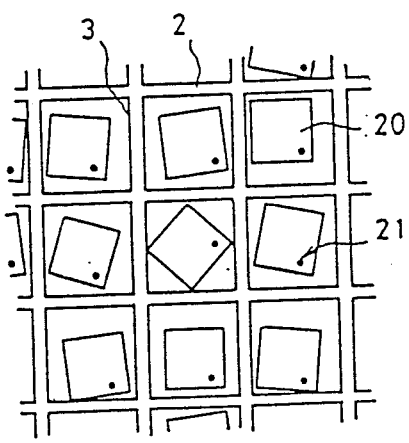
FIGS. 5a and 5b are top plan views of a portion of the tray, indicative of the way how a plurality of chips accommodated in respective concaves and each having thereon a direction identification mark are rearranged in order.

Subsequent oscillation of the tray 1 by the oscillating means 19 slides the chips 20 accommodated at random in respective concaves 4 of the tray 1 towards the lowered corners of the concaves 4. The chips 20 are gradually rearranged in respective concaves 4, as shown in FIG. 4b, and are finally positioned in the lowered corners thereof in order so that one corner of each chip 20 may be in accord with the lowered corner of one concave 4, as shown in FIG. 4c. In this way, all of the chips 20 are brought into contact with the same corners of respective concaves 4 and properly positioned therein.

Figure 2D:
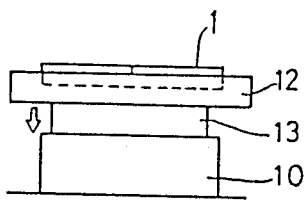
Figure 2E:
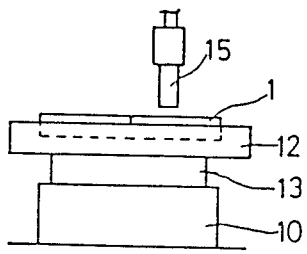
Figure 3D:
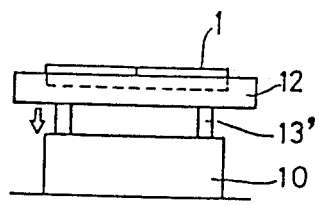
Figure 3E:
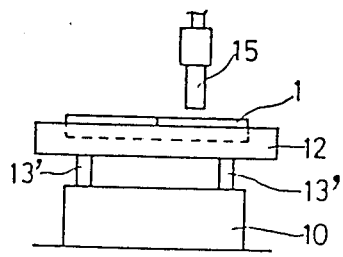

After the positioning of the chips 20, the lifter 13 or 13' is restored to its rest position shown in FIG. 2d or FIG. 3d so that the chips 20 may be picked up one by one by the collet 15, as shown in FIG. 2e or FIG. 3e. The collet 15 is movable in any desired direction to pick up each chip 20 by drawing the vacuum therethrough. During the pickup, since all the chips 20 are properly positioned in respective concaves 4, the collet 15 never fails to pick up each of them.

If the direction of each chip 20 is required to be recognized, a direction identification mark 21 may be marked on each chip 20 in advance, as shown in FIGS. 5a, 5b and 6a, 6b. Such a mark is formed in the vicinity of one corner of the chip 20, for example, at a location where no circuit pattern is formed. The direction of the chip 20 with respect to the tray 1 can be detected through the pattern recognition of the direction identification mark 21. The direction identification mark 21 can be formed by applying ink onto the chip 20 through an ink jet or by forming a desired pattern thereon when the circuit pattern is formed.

Figure 6A:
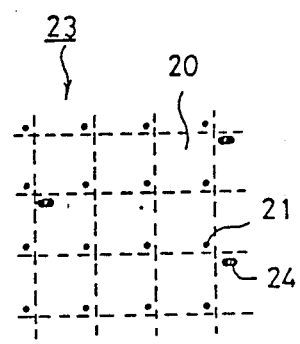
FIGS. 6a and 6b are top plan views of a plurality of semiconductor chips bonded on a semiconductor wafer, indicative of a manufacturing process thereof.
Figure 6B:
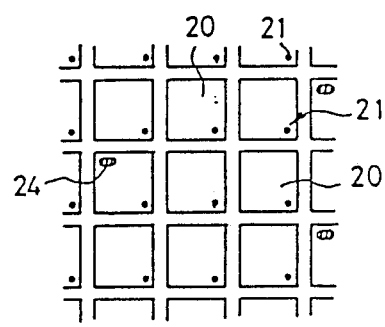

FIGS. 6a and 6b depict a manufacturing process in the case where the chips 20 are semiconductor chips.

Prior to the dicing, a plurality of direction identification marks 21 are formed on the same corners of respective chips 20 bonded on a semiconductor wafer 23, as shown in FIG. 6a. Some of the chips of poor quality are also marked each with a quality poor mark 24. During the dicing, the semiconductor wafer 23 is separated into individual chips 20, which are then picked up by any known pickup means, for example, a collet to be accommodated in respective concaves 4 of the tray 1, as shown in FIG. 6b. In this event, the chips 20 with the quality poor mark 24 are sorted when picked up by the collet or the like and never be placed on the tray 1.

Figure 5B:
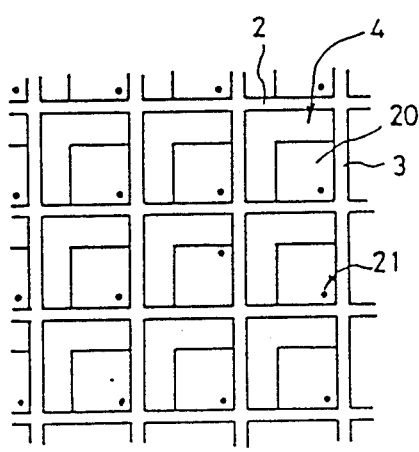

The chips 20 with the direction identification mark 21 are placed and properly positioned on the tray 1 as shown in FIG. 5b, upon oscillation thereof in the above described manner.

When each of the chips 20 is taken out from the tray 1 by the collet 15, the direction thereof is recognized by the pattern recognition of its direction identification mark 21. In this event, if any of the chips 20 is directed differently from other chips 20, its direction can be changed by rotating the tray chuck 12 or the collet 15 according to the position of the direction identification mark 21. Accordingly, even if one or more chips 20 are different in direction more than 90 degrees from any other chips 20, all of the chips 20 can be directed in the same direction when picked up from the tray 1.

Figure 7:
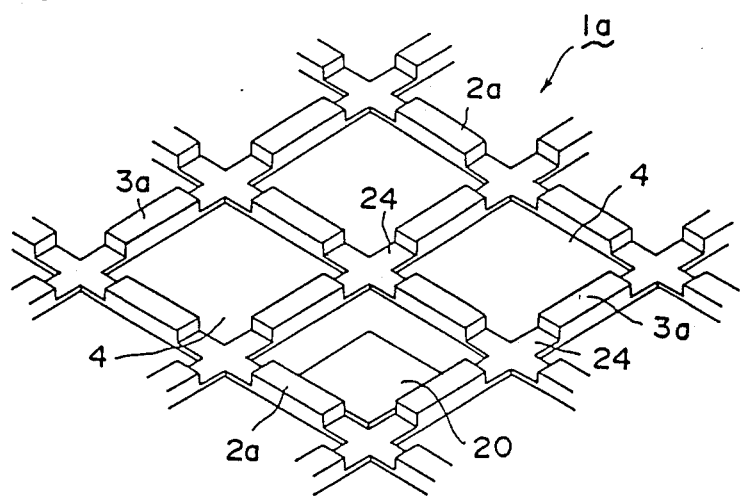
FIG. 7 is a fragmentary perspective view of a portion of the tray according to the present invention.

FIG. 7 depicts a portion of a tray 1a according to the present invention in which a plurality of cross-shaped notches 24 are formed at all crossings of partition walls 2a and 3a. The reason for this is to prevent the interference between the collet 15 and the partition walls 2a and 3a during the pickup of the chips 20.

It is to be noted that although FIG. 7 illustrates the tray 1a provided with the notches 24 formed at all the four corners of the concaves 4, at least two notches may be formed respectively at two corners positioned diagonally with respect to one concave 4.

Figure 8:
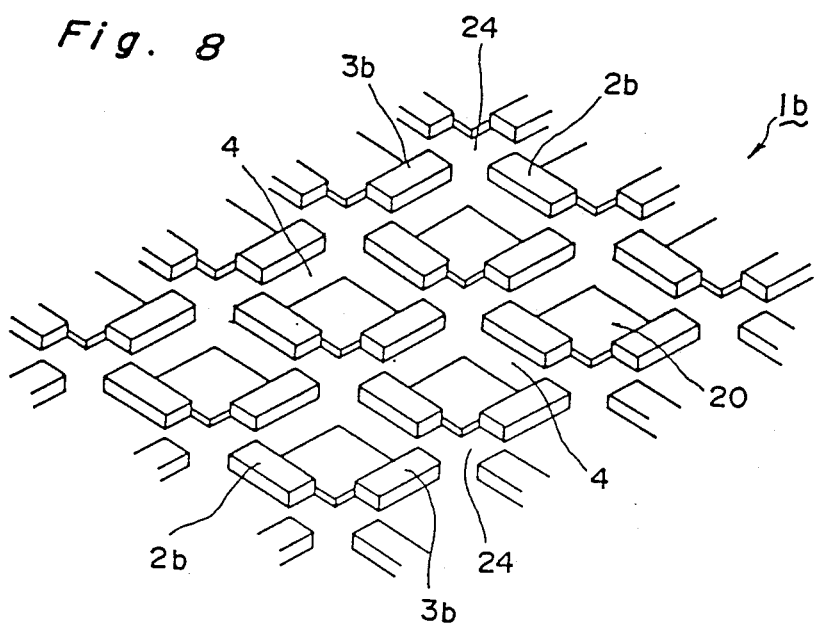
FIG. 8 is a view similar to FIG. 7, which particularly shows a modification thereof.

Alternatively, as shown in FIG. 8, a plurality of spaced rectangular parallelepipeds 2b and 3b may be bonded on the tray 1b in a fashion such that a plurality of substantially square concaves 4b are regularly spaced from one another and are each defined by four rectangular parallelepipeds 2b and 3b.

Figure 9:
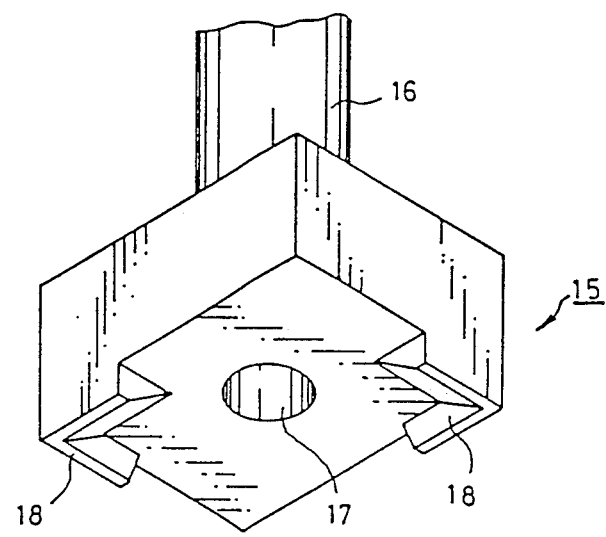
FIG. 9 is a perspective view of a vacuum pickup collet for picking up the chips one by one according to the present invention.

In this embodiment, the vacuum pickup collet 15 for picking up the chips 20 placed on the tray 1 is of a configuration as shown in FIG. 9. More specifically, the collet 15 is provided with a suction port 17 for picking up each chip 20 by drawing the vacuum therethrough and is connected with a lower end of a suction pipe 16 which is further connected with any known suction means (not shown), for example, a vacuum pump. When the collet 15 picks up each chip 20, it is brought into contact with peripheral edges of the chip 20 to attract it. To this end, two substantially L-shaped projections 18 are integrally formed with or securely connected to the lower surface of the collet 15 respectively at its diagonally positioned two corners.

In order to pick up the chips 20 placed on the tray 1, the collet 15 having the above described construction is initially rotated, prior to the downward movement thereof, so that one of the two projections 18 may be in accord with one notch 24 of a certain concave 4. Accordingly, the two projections 18 are brought into contact with the two diagonal corners of the chip 20 in a state in which one of the projections 18 is inserted into the notch 24 whereas the other projection 18 is inserted into the concave 4. In this event, since the lower surface of the collet 15 except its two corners with projections 18 is formed flat, there never occurs the interference between the collet 15 and the partition walls 2a and 3a, thereby ensuring reliable pickup of the chips 20 by the vacuum attraction.

In operation, the chips 20 accommodated in respective concaves 4 randomly slide towards the same corners of the concaves 4 and are properly positioned therein upon oscillation of the tray 1 caused by the oscillating means 19.

After the positioning of the chips 20 in respective concaves 4, the lifter 13 or 13' is restored to its rest position as shown in FIG. 2d or FIG. 3d so that the chips 20 may be readily picked up by the collet 15 one by one. In this event, since all the chips 20 are kept in contact with the same corners of respective concaves 4, the collet 15 never fails to pick them up. When one of the chips 20 is picked up by the collet 15, the projections 18 of the collet 15 are reliably brought into contact with the corners of the chip 20, since there is no interference between the collet 20 and the partition walls 2a and 3a. Accordingly, the collet 15 can correctly and speedily pick up the chip 20 by drawing the vacuum therethrough.

Although the present invention has been fully described by way of examples with reference to the accompanying drawings, it is to be noted here that various changes and modifications will be apparent to those skilled in the art. Therefore, unless such changes and modifications otherwise depart from the spirit and scope of the present invention, they should be construed as being included therein.

What is claimed is:

1. A chip mounting apparatus for mounting a plurality of chips one at a time onto a package base or a circuit board, said chip mounting apparatus comprising:
    a base;
    a support member securely held on said base;
    a tray detachably mounted in said support member and provided with a plurality of substantially square concaves each for accommodating one of said chips, said concaves being regularly spaced from one another by a plurality of partition walls formed on said tray; means associated with said support member for inclining said tray so that one corner of each concave becomes lower than any other corners thereof; and
    an oscillating means for oscillating said tray,
    whereby said chips are rearranged and positioned in the same corners of respective concaves.

2. The chip mounting apparatus according to claim 1, further comprising a vacuum pickup member for picking up said chips rearranged on said tray one at a time and a control means for controlling a relative angle between said tray and said vacuum pickup member by recognizing a direction identification mark formed on an upper surface of each chip.

3. The chip mounting apparatus according to claim 1, wherein at least two notches are formed respectively at two corners positioned diagonally with respect to one concave and two projections are formed on said vacuum pickup member to be brought into contact with diagonally located two corners of each chip.

* * * * *